(12) United States Patent  
Miller

(10) Patent No.: US 11,070,044 B2  
(45) Date of Patent: *Jul. 20, 2021

(54) SYSTEMS AND METHODS FOR DETECTING AND IDENTIFYING ARCING

(71) Applicant: HUBBELL INCORPORATED, Shelton, CT (US)

(72) Inventor: Gary Michael Miller, Kearneysville, WV (US)

(73) Assignee: Hubbell Incorporated, Shelton, CT (US)

( * ) Notice: Subject to any disclaimer, the term of this patent is extended or adjusted under 35 U.S.C. 154(b) by 103 days.

This patent is subject to a terminal disclaimer.

(21) Appl. No.: 16/657,714

(22) Filed: Oct. 18, 2019

(65) Prior Publication Data

US 2020/0052478 A1 Feb. 13, 2020

Related U.S. Application Data

(63) Continuation of application No. 14/206,093, filed on Mar. 12, 2014, now Pat. No. 10,461,519.

(60) Provisional application No. 61/781,553, filed on Mar. 14, 2013.

(51) Int. Cl.
  *H02H 1/00* (2006.01)
  *G01R 31/14* (2006.01)

(52) U.S. Cl.
  CPC .......... *H02H 1/0015* (2013.01); *G01R 31/14* (2013.01)

(58) Field of Classification Search
  None
  See application file for complete search history.

(56) References Cited

U.S. PATENT DOCUMENTS

| | | |
|---|---|---|
| 5,047,724 A | 9/1991 | Boksiner et al. |
| 5,434,509 A | 7/1995 | Blades |
| 5,452,223 A | 9/1995 | Zuercher et al. |
| 5,475,312 A | 12/1995 | Sedding et al. |
| 5,485,093 A | 1/1996 | Russell et al. |
| 5,659,453 A | 8/1997 | Russell et al. |
| 5,729,145 A | 3/1998 | Blades |
| 5,963,406 A | 10/1999 | Neiger et al. |
| 5,986,860 A | 11/1999 | Scott |
| 6,088,205 A | 7/2000 | Neiger et al. |
| 6,192,317 B1 | 2/2001 | Yazici et al. |
| 6,445,189 B1 | 9/2002 | Pakonen et al. |
| 6,459,273 B1 | 10/2002 | Dollar, II et al. |
| 6,839,208 B2 | 1/2005 | MacBeth et al. |
| 7,062,388 B2 | 6/2006 | Rivers et al. |
| 7,388,384 B2 | 6/2008 | Kato et al. |
| 7,403,129 B2 | 7/2008 | Zhou et al. |
| 7,579,843 B2 | 8/2009 | Younsi et al. |
| 7,627,400 B2 | 12/2009 | Dutoya et al. |
| 7,750,646 B2 | 7/2010 | Maity et al. |
| 7,865,321 B2 | 1/2011 | Muthu-Manivannan et al. |

(Continued)

*Primary Examiner* — Brent A. Fairbanks
(74) *Attorney, Agent, or Firm* — Dickinson Wright PLLC

(57) ABSTRACT

Systems and methods for detecting and identifying arcing are disclosed. A method of detecting arcing includes obtaining data indicative of voltage and data indicative of current, determining a waveform of a cycle of a primary load current according to the data indicative of current, determining at least one noise signal according to the determined waveform of a cycle of the primary load current and the data indicative of current, determining a probability density of the noise signal according to a time window, and comparing the probability density of the noise signal with at least one model probability density.

20 Claims, 4 Drawing Sheets

(56) References Cited

U.S. PATENT DOCUMENTS

| | | |
|---|---|---|
| 8,457,910 B2 | 6/2013 | Muthu-Manivannan et al. |
| 8,924,169 B1 | 12/2014 | Ledenev et al. |
| 2002/0008950 A1 | 1/2002 | Kim et al. |
| 2003/0072113 A1 | 4/2003 | Wong et al. |
| 2003/0227290 A1 | 12/2003 | Parker |
| 2004/0252425 A1 | 12/2004 | Baldwin et al. |
| 2005/0268264 A1 | 12/2005 | Nagai |
| 2006/0215064 A1 | 9/2006 | Dawson |
| 2006/0215335 A1 | 9/2006 | Deshpande et al. |
| 2007/0058304 A1 | 3/2007 | Parker et al. |
| 2007/0133134 A1 | 6/2007 | Kilroy |
| 2007/0168143 A1 | 7/2007 | Axenbeck |
| 2008/0033602 A1 | 2/2008 | Dutoya et al. |
| 2008/0106832 A1 | 5/2008 | Restrepo et al. |
| 2010/0097733 A1 | 4/2010 | Tomimbang |
| 2010/0157486 A1 | 6/2010 | Parker |
| 2010/0169030 A1 | 7/2010 | Parlos |
| 2010/0201371 A1 | 8/2010 | Valcore et al. |
| 2011/0043214 A1 | 2/2011 | Potter et al. |
| 2011/0249370 A1 | 10/2011 | Nayak et al. |
| 2012/0112760 A1 | 5/2012 | Yoscovich et al. |
| 2013/0169290 A1 | 7/2013 | Shea |
| 2013/0221973 A1 | 8/2013 | Whisenand et al. |
| 2013/0226479 A1 | 8/2013 | Grosjean |
| 2014/0168843 A1 | 6/2014 | Privitera et al. |
| 2014/0270205 A1 | 9/2014 | Miller |
| 2014/0278158 A1 | 9/2014 | Miller |
| 2018/0115144 A1 | 4/2018 | Murnane | ns and Methods for Detecting
SYSTEMS AND METHODS FOR DETECTING AND IDENTIFYING ARCING

CROSS-REFERENCE TO RELATED APPLICATION

The present application is a continuation application of U.S. patent application Ser. No. 14/206,093, filed on Mar. 12, 2014, in the U.S. Patent and Trademark Office, which claims the right of priority under 35 U.S.C. § 119 (e) to U.S. Provisional Application No. 61/781,553, filed on Mar. 14, 2013, in the U.S. Patent and Trademark Office, the entire contents of which are hereby incorporated by reference.

FIELD OF THE DISCLOSURE

The present application relates to the detection and identification of arcing, for example, for use with arc fault circuit interrupters.

BACKGROUND OF THE DISCLOSURE

General Description of Arcing in Air and Solid Materials:

Arcing can occur as a result of electrical wire damage. For example, a nail or a screw may puncture insulation or create a small break in a conductor. As a result, an arc can form, and traverse air or punch through compromised insulation. While all arcs are generally formed in similar ways, the electrical characteristics of arcing through air can be different from those of arcing through carbonized insulation.

An arc is an accelerated electron phenomenon. As an electric field increases, for example due to increasing voltage, electrons typically begin to move along the electric field, skipping from one atom to another. In a solid material, an electron flow over a finite amount of time can be considered a current. This current may be seen as an arc. Yet, when electrons are stripped from atoms at one end of a solid material, a higher electric field strength is typically required to strip an additional electron. The arc path can as a result become unsuitable for sustaining an arc, forcing the arc to find another path. Over time, a used path can eventually recover, though several other arc paths may be used before a path or a portion of a path regains its suitability. In air, a similar phenomenon may occur. Yet, the movement of air can create additional features of a discharge. For example, "previous path" may not exist in the context of an arc in air, because of the movement of air. Furthermore, even when air is highly confined, it can be heated during arcing, resulting in substantial turbulence within the space.

Arcs in a solid material tend to break molecular bonds. They can encourage new bonds and new chemical composition in the solid material. In most plastics, for example, an arc can dissociate carbon from hydrogen. As hydrogen escapes into air, carbon is left in the plastic, usually with a black appearance, in a process often referred to as carbonization. Since carbon is more conductive than most plastics, areas of carbonization tend to be locations where arcing often recurs. These areas are usually in the form of small black pits, rather than large areas of carbon, which can nevertheless occur in extreme cases.

Although devices exist for detecting arcing in electrical circuits, they typically face such problems as oversensitive arcing detection or erroneous arcing identification. For example, conventional arc fault circuit interrupters often trip when detecting arcing due to the normal functioning of electrical components such as electric motors, rather than when detecting arcing due to electrical wire damage. Therefore, there is a need for a system that allows for more accurate detection and identification of potentially unwanted arcing.

SUMMARY OF THE DISCLOSURE

Illustrative embodiments of the present invention address at least the above problems and/or disadvantages, and provide at least the advantages described below.

An illustrative method of detecting and identifying arcing can include obtaining data indicative of voltage and data indicative of current, determining a waveform of a cycle of a primary load current according to the data indicative of current, determining at least one noise signal according to the determined waveform of a cycle of the primary load current and the data indicative of current, determining a probability density of the at least one noise signal according to a time window, and comparing the probability density of the at least one noise signal with at least one model probability density.

An illustrative system for detecting and identifying arcing can include a processor and computer-readable media. The processor can be adapted to obtain and store on the computer-readable media data indicative of voltage and data indicative of current. The processor can be further adapted to determine a waveform of a cycle of a primary load current according to the data indicative of current. The processor can be further adapted to determine at least one noise signal according to the determined waveform of a cycle of the primary load current and the data indicative of current. The processor can be further adapted to determine a probability density of the at least one noise signal according to a time window. The processor can be further adapted to compare the probability density of the at least one noise signal with at least one model probability density.

An illustrative system for detecting and identifying arcing can include a current transformer and a resistive load adapted to convert a current from a load to a proportional voltage, an analog-to-digital current converter adapted to convert the current to a digitized current at a sample frequency, an analog-to-digital voltage converter adapted to convert the voltage to a digitized voltage at the sample frequency, a learned primary load block adapted to determine a waveform of a cycle of a primary load current, a subtractor block adapted to determine at least one noise signal, an arc window comparator adapted to determine a time window, a histogram probability density block adapted to determine a probability density of the at least one noise signal according to the time window, and a comparator block adapted to compare the probability density of the at least one noise signal with at least one model probability density.

An illustrative system for determining a model probability density can comprise a current transformer and a resistive load adapted to convert a current from a load to a proportional voltage, an analog-to-digital current converter adapted to convert the current to a digitized current at a sample frequency, an analog-to-digital voltage converter adapted to convert the voltage to a digitized voltage at the sample frequency, a learned primary load block adapted to determine a waveform of a cycle of a primary load current according to the digitized current, a subtractor block adapted to determine at least one noise signal according to the determined waveform of a cycle of the primary load current and the digitized current, an arc window comparator adapted to determine a time window; a histogram probability density block adapted to determine a probability density of the at least one noise signal according to a time window, and computer-readable media adapted to store the probability density as a model probability density.

BRIEF DESCRIPTION OF THE DRAWINGS

The above and other exemplary features, aspects and advantages of the present invention will become more apparent from the following detailed description of certain exemplary embodiments thereof when taken in conjunction with the accompanying drawings in which.

DETAILED DESCRIPTION OF ILLUSTRATIVE EMBODIMENTS

Figure 1:
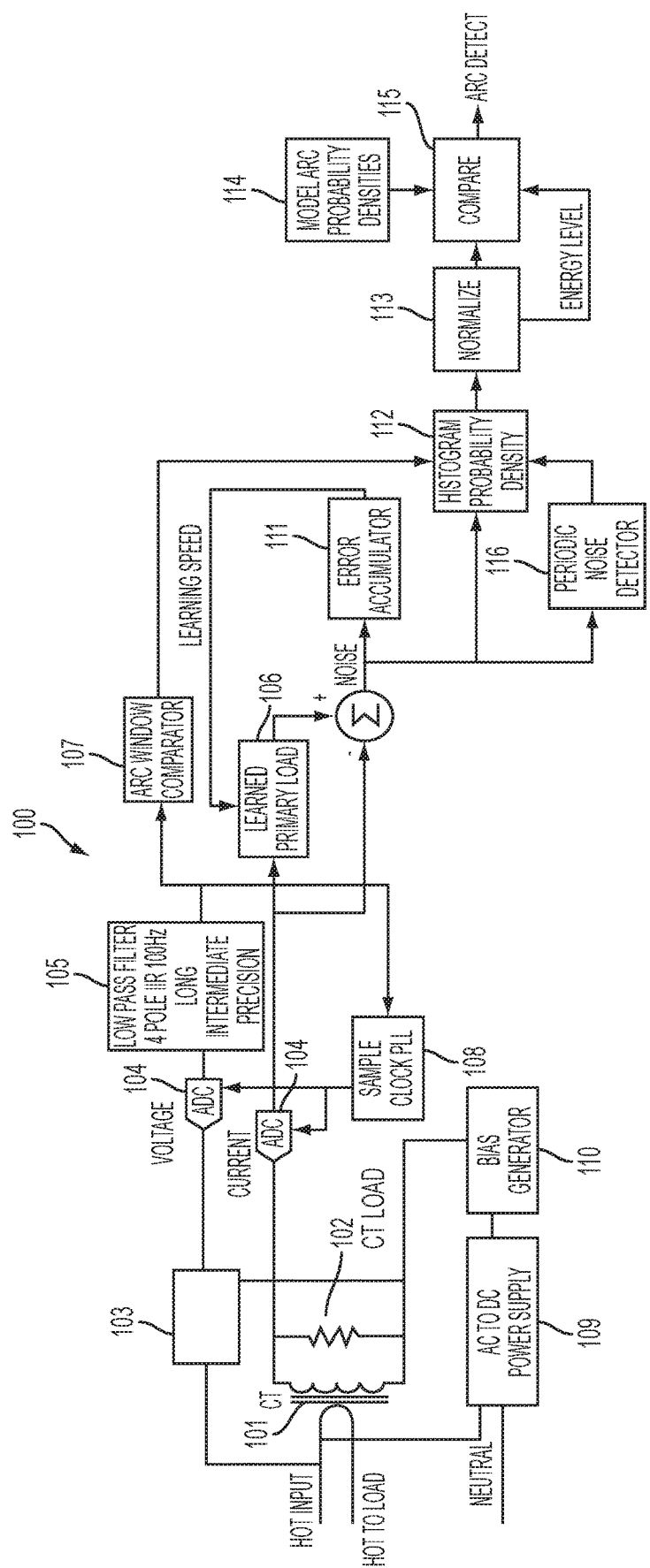
FIG. 1 illustrates a processing block diagram of a system for detecting and identifying arcing according to an illustrative embodiment of the present invention.

This description is provided to assist with a comprehensive understanding of illustrative embodiments of the present invention described with reference to the accompanying drawing figures. Accordingly, those of ordinary skill in the art will recognize that various changes and modifications of the illustrative embodiments described herein can be made without departing from the scope and spirit of the present invention. Also, descriptions of well-known functions and constructions are omitted for clarity and conciseness. Likewise, certain naming conventions, labels and terms as used in the context of the present disclosure are, as would be understood by skilled artisans, non-limiting and provided only for illustrative purposes to facilitate understanding of certain illustrative implementations of the embodiments of the present invention.

Generally referring to FIGS. 1-4, systems and methods can detect and identify or assist in the detection and identification of arcing.

Probability Densities Associated with Arcing:

According to an illustrative embodiment of the present invention, a probability density of a fractal trajectory can be associated with arcing. This probability density can be represented or stored, for example, in the form of a histogram, or any other form of data representation or storage. A histogram can be indicative of a current signal associated with arcing, and can include a plurality of counts. Each count can be associated with an amplitude interval. Each count can be indicative of a number of amplitude bits from the current signal, which are within the amplitude interval associated with the count.

According to an illustrative embodiment of the present invention, a probability density can be experimentally obtained for arcing in any medium, and stored as a model probability density. For example, a model probability density for arcing through air, a model probability density for arcing through carbonized insulation, or model probability density for other potentially unwanted arcing can be obtained. These model probability densities can be stored, for example, in computer-readable media, including, but not limited to, non-transitory computer-readable media.

Matching or comparing a measured probability density to a model probability density can help distinguish an arc from random noise or nonlinear loads.

Detecting and Identifying Arcing Using Probability Densities:

In an illustrative embodiment of the present invention, an arc fault circuit interrupter can be implemented with systems and methods using model probability densities to detect and identify potentially unwanted arcing. A noise signal potentially containing potentially unwanted arcing can be extracted from a measured current. For example, a primary load current, such as a substantially periodic portion of the current, can be determined and subtracted from the measured current. For example, the primary load current can be learned by a detector and subtracted from the measured current. This learning operation can be performed by, for example, finding a rolling average of the current for each interval within a cycle.

Sudden Load Changes:

An illustrative arcing detector can be implemented to compensate for sudden load changes, such as those created by periodically operating devices including, for example, conventional electric skillets or thermostatically controlled heaters, and other devices which may automatically or manually turn on and off. The arcing detector may need to quickly converge to the load waveform in a case of a device turning on. An error accumulator can be implemented for such quick convergence.

Normal Periodic Arcing:

An illustrative arcing detector can be implemented to ignore generally normal periodic arcing created by devices such as electric motors. In a typical electric motor, a carbon brush can be pressed against the rotor in the motor. As the rotor spins, the brushes can contact successive coils in the rotor. The make and break operation of the commutator can create normal periodic arcing, which can sometimes be visible through ventilation holes of a device, close to the brushes. These motors are conventionally used in most appliances, such as fans, vacuum cleaners, hair dryers, water pumps, and other such devices. Such normal periodic arcing may be acceptable to the normal functioning of electrical equipment, and thus may not be desired to cause an arc fault circuit interrupter to trip.

Unlike potentially unwanted arcing such as arcing on a main line, normal periodic arcing is typically not synchronized to a primary load frequency. Although synchronous motors can be synchronized with a main line, these motors typically produce minimal noise. Generally, a source of normal periodic arcing, such as a typical motor, may not be synchronized to the main line, such that normal periodic arcing can occur at any time during a cycle.

By contrast, potentially unwanted arcing, such as arcing due to a damaged wire, generally occurs only close to a peak voltage portion of the current, for example, where an electric field at an arc point reaches its peak. Consequently, amplitude data at a peak voltage may be used to detect and identify potentially unwanted arcing.

Moreover, the large amount of normal periodic arcing noise typically created by a commutated motor can be detected, and the period of this normal periodic arcing noise can be determined. For example, a normal periodic arcing noise period can be a multiple of a motor speed, and can be detected or predicted using a periodic noise detector. Usually, normal periodic arcing noise may occur away from the voltage peak of a cycle. If normal periodic arcing noise is however predicted to be present during the voltage peak, data from this voltage peak may not be included in a measured probability density histogram.

Potentially Unwanted Arcing:

According to an illustrative embodiment of the present invention, the presence of potentially unwanted arcing can be determined by comparing a histogram indicative of the noise signal at a peak voltage portion of the current, or at another time window of the current, over a measuring time, with a model probability density. Potentially unwanted arcing can be determined if sufficient energy is present in the histogram, and if the histogram adequately matches a model probability density.

Alternatively, a histogram indicative of the noise signal at a peak voltage portion of the current, or at another time window of the current, over a measuring time, can be stored as a model probability density. For model probability density, the current can be from a conductor on which arcing is induced through a medium of a desired composition, such as, for example, air or carbon. Moreover, one skilled in the art will appreciate that arcing will likely occur through any medium in any electrical system after a sufficiently long period of time, and that such arcing is more likely to occur within a shorter period of time in electrical systems with higher voltage. This model probability density can be then used with systems or methods for detecting and identifying arcing according to illustrative embodiments of the present invention.

Additional Illustrative Embodiments

In illustrative embodiments of the present invention, a measuring device for current and a measuring device for voltage may be implemented, such that the measured voltage and current are digitized and provided to multiple processes. Voltage can be used to synchronize a sampling rate to a primary load frequency. Voltage can be low-pass filtered, and the amplitude can be measured. An arc detection can be only initiated during a desired portion of the voltage waveform, such as, for example, the top 10% of the voltage waveform. The current can be sampled, and an average waveform for one cycle can be determined. The average current waveform can be subtracted from the input waveform. Significant deviations from expected current outside the peak can be detected. A periodicity of the deviations can be detected, while searching for normal periodic arcing noise. A peak containing normal periodic arcing noise can be excluded from a histogram of measured probability density. After a number of cycles or time, the histogram can be compared to model probability densities for arcing in one or more media, and potentially unwanted arcing can be determined if the histogram adequately matches a model histogram, and if sufficient energy is present in the histogram. An arc fault circuit interrupter can be tripped if potentially unwanted arcing is determined.

FIG. 1 illustrates a processing block diagram 100 of a system for detecting and identifying arcing according to an illustrative embodiment of the present invention, which may include current transformer 101, resistive load 102, scale block 103, analog-to-digital converter block(s) 104, low-pass filter block 105, learned primary load block 106, arc window comparator block 107, phase locked loop block 108, power supply block 109, bias generator block 110, error accumulator block 111, histogram probability density block 112, normalizing block 113, model probability density block 114, comparing block 115, and periodic noise detector block 116. It will be understood by a person having ordinary skill in the art that a processor, for example executing instructions stored on computer-readable media, can perform or simulate functions substantially similar to some or all of the functions of elements 101-116, for example, using computer-readable media and software. Computer-readable media can include, but is not limited to, non-transitory computer-readable media.

Figure 2:
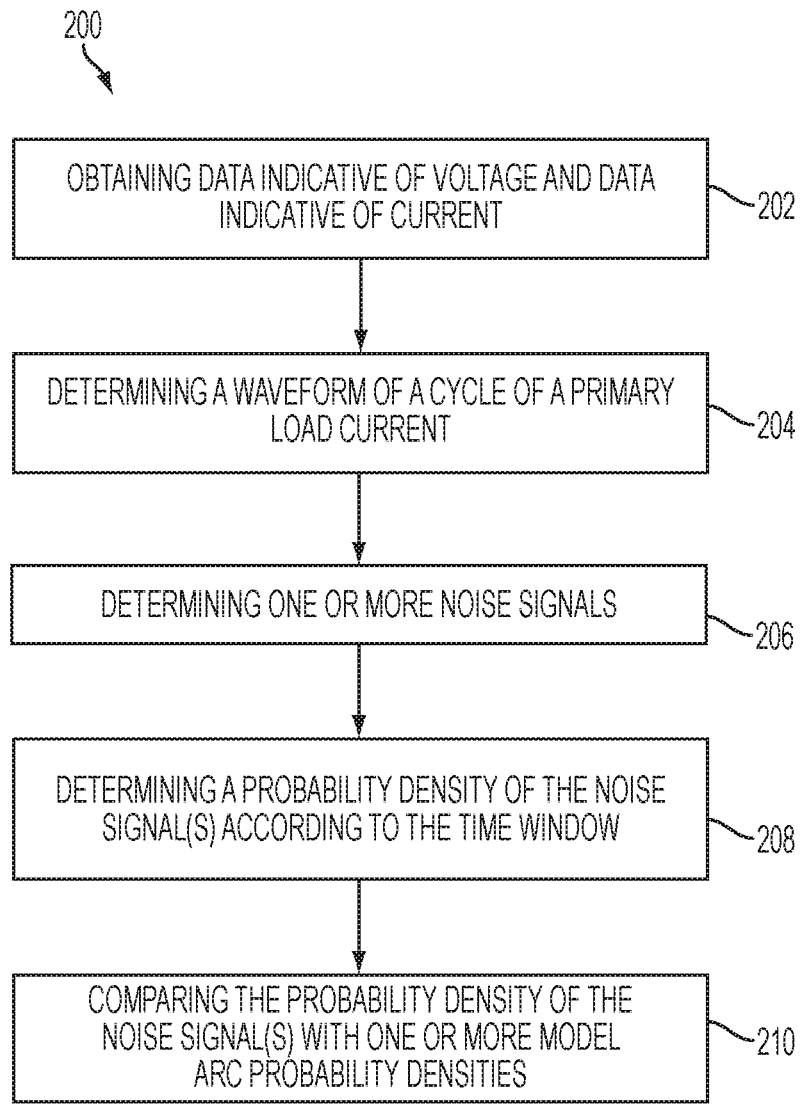
FIG. 2 shows an illustrative method of detecting and identifying arcing according to an illustrative embodiment of the present invention.

FIG. 2 shows an illustrative method 200 of detecting and identifying arcing according to an illustrative embodiment of the present invention, which can include obtaining data indicative of voltage and data indicative of current at step 202, determining a waveform of a cycle of a primary load current at step 204, determining one or more noise signals at step 206, determining a probability density of one or more noise signals according to a time window at step 208, and comparing the probability density of one or more noise signals with one or more model probability densities at step 210.

At step 202, data indicative of voltage and data indicative of current, such as, for example, a digitized voltage and a digitized current, can be obtained or determined from a load. For example, determining a data indicative of voltage and data indicative of current can include obtaining a current and converting the current to a proportional voltage by a current transformer and a resistive load, reducing the voltage to an amplitude and a DC offset suitable for analog-to-digital conversion, converting the current to a digitized current by an analog-to-digital current converter, and converting the voltage to a digitized voltage by an analog-to-digital voltage converter.

A combination of current transformer 101 and a resistive load 102 can be used to convert current in a hot load to a proportional voltage. Other methods for measuring current can be used, such as current sensing using a low ohm resistive element and amplifier, or any other method known in the art. The current can be obtained, for example by a current transformer.

Scale block 103 can reduce a voltage level to an amplitude and DC offset suitable for analog-to-digital conversion. A typical input voltage may be 125 Vrms AC, while most converters may only accept up to 3V. Yet, any input voltage may be used. For example, a voltage of about 120 V, 220 V, or 7,500 V can be used to obtain a model probability density for arcing, and/or to detect and identify arcing. The scale block operation can provide attenuation and can center a signal around a bias voltage.

Analog-to-digital converter blocks 104 can include a voltage converter block and a current converter block. Illustrative embodiments can include one or more analog-to-digital converters. In an illustrative embodiment of the present invention, a voltage converter may only require 10 bits of resolution, while a current converter may require substantially better resolution. The resolution of the current may need to be around 1 mA per bit. In a 15 Arms circuit, the maximum peak to peak current may be 42.4 A. A 16 bit analog-to-digital converter may have a resolution of 0.65 ma. Increasing the current maximum may require increasing the resolution of the current analog-to-digital converter.

Power supply block 109 can be suitable for powering analog and digital electronics in a system. Bias generator 110 can be a precision voltage source set to the center of a range of the analog-to-digital converters. The input analog voltage may be biased such that half an analog-to-digital converter range is above the bias and half the analog-to-digital converter range is below the bias.

Low-pass filter block 105 can remove high frequency noise from the voltage or the data indicative of voltage. In an exemplary implementation, low-pass filter block 105 can include a 4 pole IIR 100 Hz LONG intermediate precision low-pass filter.

Phase locked loop block 108 can generate a sample clock for the analog-to-digital converters using the data indicative of voltage. A sample clock with a frequency equal to a multiple of the line frequency may simplify the implementation of learned primary load block 106. For example, a system with a 60 Hz line frequency and a sample rate of 48,000 samples per second may have 800 samples for a single sine wave. In this case, the learned primary load current may need a storage size of 800 samples to represent one cycle of the waveform. If the sample frequency and line frequency are not exact multiples, the storage requirement may include some fraction of a sample. While signal processing techniques exist to handle this situation, it may be easier to use a multiple of the line frequency.

Phase locked loop block 108 may lock in on a voltage cycle. A voltage cycle frequency can be determined according to the voltage cycle. A sample period can be determined such that a sample frequency is a multiple of the voltage cycle frequency.

Alternatively, at step 202, a processor can obtain or determine data indicative of voltage and data indicative of current, which can be stored on computer-readable media including, but not limited to, non-transitory computer-readable media. A processor, for example executing instructions stored on computer-readable media, can perform functions substantially similar to some or all of the functions of scale block 103, analog-to-digital converter blocks 104, low-pass filter block 105 and phase locked loop block 108. For example, a processor can reduce a voltage level, convert analog voltage or current to digital voltage or current, remove high frequency noise from the voltage or the data indicative of voltage, and/or lock in on a voltage cycle to determine a sample period.

At step 204, a waveform of a cycle of the current can be determined. Learned primary load block 106 can determine a shape of the primary load current for one current cycle. The primary load current may not be sinusoidal. For example, electronic power supplies, light dimmers, and many other devices may tend to pull more power during the peak voltage. Learned primary load block 106 can continuously average the waveform of one or more cycles of the data indicative of current. In an illustrative embodiment of the present invention, learned primary load block 106 can determine and/or remember a substantially periodic shape of the primary load current for a single cycle.

Alternatively, at step 204, a processor can determine a waveform of a cycle, which can be stored, for example, on computer-readable media including, but not limited to, non-transitory computer-readable media. A processor, for example executing instructions stored on computer-readable media, can perform perform functions substantially similar to some or all of the functions of learned primary load block 106. For example, a processor can continuously average the waveform of one or more cycles of the data indicative of current and/or store a substantially periodic shape of the primary load current for a single cycle in computer-readable media, including, but not limited to, non-transitory computer-readable media.

At step 206, a noise signal can be determined, for example, by subtracting the determined waveform of a cycle of the primary load current from a cycle of the data indicative of current. The difference can be current from potentially unwanted arcs as well as noisy sources such as electric motors. In an illustrative embodiment of the present invention, a subtractor block can subtract the determined waveform of a cycle of the primary load current from a cycle of the data indicative of current.

Error accumulator block 111 can determine an error equal to the difference between the determined waveform of a cycle of the primary load current and the data indicative of current. The error can thus be substantially equal to a noise signal. Error accumulator block 111 may only permit learned primary load block 106 to make periodic adjustments to the learned load at each cycle equal to a fraction of the error. For example, error accumulator block 111 may only permit learned primary load block 106 to add or subtract 10% of the error to the learned load at each cycle. Error accumulator block 111 may thus help recognize sudden load changes and converge to the load waveform quickly.

Alternatively, at step 206, a processor can determine a noise signal, for example, by subtracting the determined waveform of a cycle of the primary load current from a cycle of the data indicative of current waveform of a cycle. The noise signal can be stored on computer-readable media including, but not limited to, non-transitory computer-readable media. A processor and/or computer-readable media can perform functions substantially similar to some or all of the functions of error accumulator block 111. For example, a processor can determine an error equal to the difference between the determined waveform of a cycle of the primary load current and the data indicative of current. The error can be substantially equal to a noise signal. A processor may only permit periodic adjustments to the learned load at each cycle equal to a fraction of the error.

At step 208, a probability density of one or more noise signals can be determined according to a time window.

A time window can be determined. For example, arc window comparator block 107 can determine a time window as a time interval intended for locating potentially unwanted arcs. A time window can be close to the peak voltage or an otherwise upper portion of a voltage waveform. For example, a time window can be determined by determining a time interval associated with the top 10% of a cycle of the data indicative of voltage. Other portions of the voltage waveforms can also be used. The time window can be determined according to any desired time window value.

Alternatively, a processor can determine a time window, which can be stored on computer-readable media including, but not limited to, non-transitory computer-readable media. A processor, for example executing instructions stored on computer-readable media, can perform functions substantially similar to some or all of the functions of arc window comparator block 107.

Determining a probability density can include determining a histogram indicative of one or more noise signals. The histogram can be contained in histogram probability density block 112. The histogram can include a plurality of counts. Each count can be associated with an amplitude interval. Each count can be indicative of a number of amplitude bits both within the time window of one or more noise signals and within the amplitude interval associated with the count.

For example, the amplitude of the noise during the time window can be compared to a set of evenly spaced fixed values. For example, an illustrative implementation may include 20 comparators equal to 10 mA, 20 mA, 30 mA . . . 200 mA. Each time a current amplitude value falls between two comparators, a counter associated with that interval can be incremented. In a simple illustrative implementation, the values can be collected for a fixed period of time up to 5 seconds, or for a fixed number of cycles. In an illustrative embodiment of the present invention, a histogram of, for example, 20 values from the 20 counters, can be forwarded to a comparing operation in comparing block 115. Alternatively, in more sophisticated illustrative embodiments, each sample may cause one counter to increment while the other 19 counters may be decreased by a fraction. The result can be essentially 20 low-pass filters (with one pole), which can decay exponentially when not incremented. This may eliminate a 5 second delay when collecting the histogram, and may permit the comparing operation in comparing block to be performed on each cycle during the time window.

If normal periodic arcing noise is predicted to be present or is otherwise detected or identified during the time window of a noise signal, a probability density of one or more noise signals may not include this noise signal. Such determination can be performed with periodic noise detector block 116.

Alternatively, at step 208, a processor can determine a probability density of one or more noise signals according to the time window. This probability density can be stored on computer-readable media including, but not limited to, non-transitory computer-readable media. A processor, for example executing instructions stored on computer-readable media, can perform functions substantially similar to some or all of the functions of histogram probability density block 112 and periodic noise detector block 116. For example, a processor can determine a histogram indicative of one or more noise signals. The histogram can be stored in computer-readable media including, but not limited to, non-transitory computer-readable media. The histogram can include a plurality of counts. Each count can be associated with an amplitude interval. Each count can be indicative of a number of amplitude bits both within the time window of one or more noise signals and within the amplitude interval associated with the count. A processor can determine, detect, identify or predict normal periodic arcing present during the time window of a noise signal. If normal periodic arcing noise is predicted to be present or is otherwise detected, identified or determined during the time window of a noise signal, a probability density of one or more noise signals may not include this noise signal.

At step 210, the probability density of one or more noise signals according to the time window can be compared to one or more model probability densities. A model probability density may be a model probability density stored in storage media including, but not limited to, computer-readable media.

Normalizing block 113 can normalize the probability density of one or more noise signals. For example, a processing block can find the highest energy or amplitude value in the amplitude intervals. Each amplitude interval can be divided by this value. The result can be a probability density including a maximum value of 1.0. Similarly, model probability densities may already be stored in a normalized form. This process may permit comparing a shape of the probability density of one or more noise signals without concern for the actual value of the amplitude. Another byproduct of normalization may be a measurement of energy.

This energy measurement can be performed here or on data input to histogram probability density block 112. If the energy level is too low, a positive arc detection may not be determined. The intervals in the probability density of one or more noise signals can contain a sufficient amount of energy if they contain more energy than a minimum energy value. Alternatively, since energy is proportional to the square of the amplitude, the intervals in the probability density of one or more noise signals can contain a sufficient amount of energy if the highest amplitude is greater than a minimum amplitude value.

The normalized probability density of one or more noise signals can then be compared to model probability densities. For example, model probability density block 114 can be a fixed storage, which can contain one or more model probability densities of arc types, including, for example, a probability density for an arc in air and/or a probability density for arcing through carbonized insulation.

Comparing block 115 can compare the normalized probability density of one or more noise signals from normalizing block 113 to the model probability densities in model probability density block 114. An exact match may not be required. The comparing operation may including determining whether the normalized probability density is similar to at least one of the model probability densities in model probability density block 114 according to a pattern matching algorithm. If a sufficiently close match is found and the probability density of one or more noise signals contains sufficient energy, the arc may be detected and identified, and may be indicated as a positive arc detection at the output, which can cause an arc fault circuit interrupter to trip. A circuit may remain open until it is closed or until the device is reset, manually or automatically.

Whether the normalized probability density is similar to at least one of model probability densities can be determined by pattern matching. For example, if the counts associated with a histogram of the normalized probability density are within a range from the corresponding counts associated with a histogram of a model probability density, similarity can be determined. Alternatively, if the constant coefficients of a polynomial approximation of the histogram of the normalized probability density are within a range from the corresponding constant coefficients of a polynomial approximation of the counts associated with a histogram of a model probability density, similarity can be determined. Alternatively, any other pattern matching methods or algorithms known in the art can be used. Some algorithms may include shifting data to allow for easier comparison of the normalized probability density to a model probability density.

Alternatively, at step 210, a processor can compare the probability density of one or more noise signals according to the time window to one or more model probability densities. A model probability density may be stored in computer-readable media including, but not limited to, non-transitory computer-readable media. A processor, for example executing instructions stored on computer-readable media, can perform functions substantially similar to some or all of the functions of histogram probability density block 112, normalizing block 113, model probability density block 114 and comparing block 115. For example, a processor can normalize the probability density of one or more noise signals. A processor can find the highest energy or amplitude value in the amplitude intervals and divide each amplitude interval by this value. A processor can compare the normalized probability density of one or more noise signals to model probability densities. A processor can determine if the probability of one or more noise signals contains sufficient energy using a minimum energy value stored in computer-readable media including, but not limited to, non-transitory computer-readable media. If a sufficiently close match is found and the probability density of one or more noise signals contains sufficient energy, the arc may be detected and identified, and indicated as a positive arc detection at the output, which can cause an arc fault circuit interrupter to trip. A circuit may remain open until it is closed or until the device is reset, manually or automatically. The methods and system disclosed herein in accordance with illustrative embodiments of the present invention can be particularly useful in applications where an arc of relatively small size exists over a considerable period of time. For example, it can be useful to employ a method or system in accordance with illustrative embodiments of the present invention to detect an arc in the electrical wiring system of an airplane or cruise ship or other location where people are generally not present during a testing period and therefore having to comply with UL standard arc detection time constraints.

Figure 3:
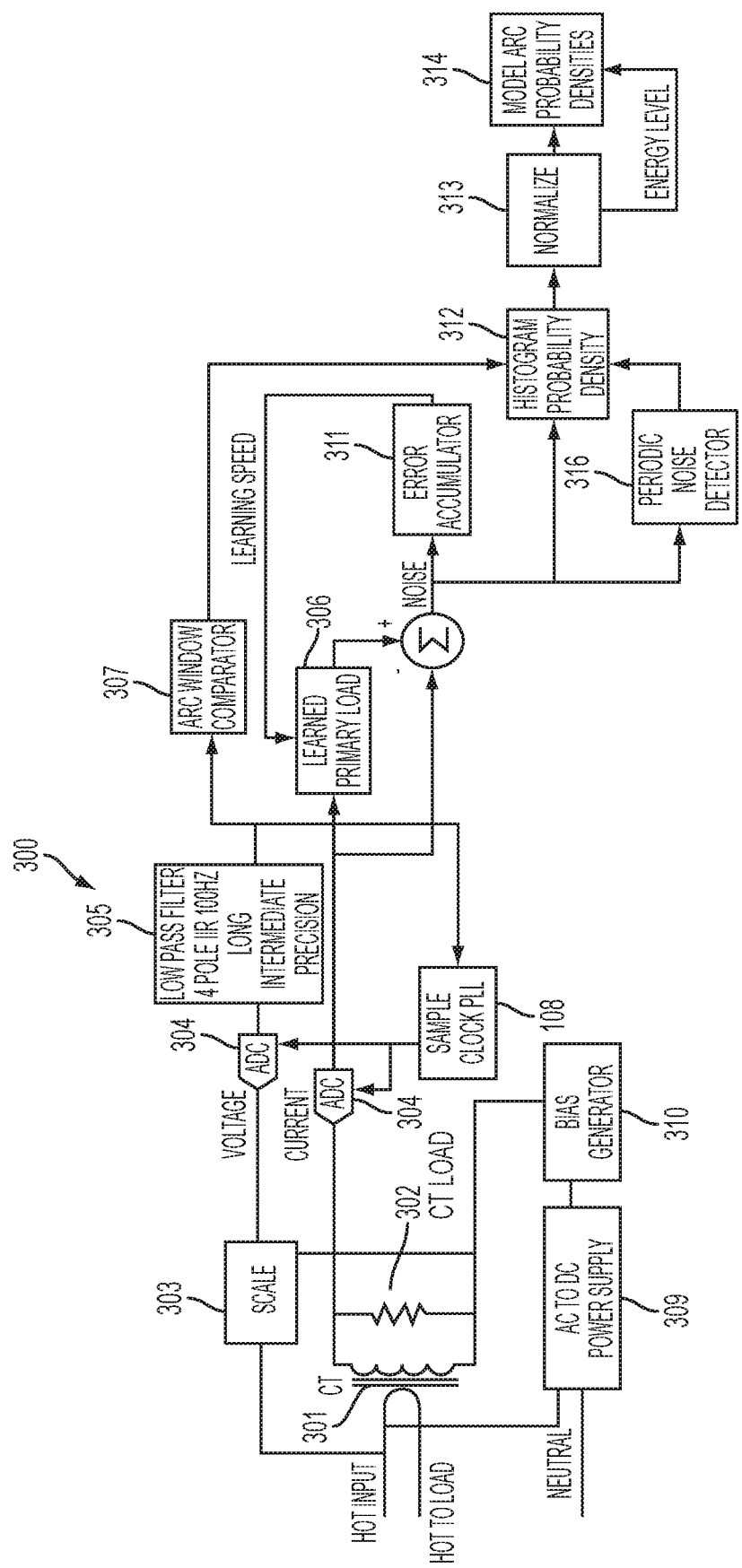
FIG. 3 illustrates a processing block diagram of a system for determining a model probability density according to an illustrative embodiment of the present invention.

FIG. 3 illustrates a processing block diagram 300 of a system for determining a model probability density according to an illustrative embodiment of the present invention, which may include current transformer 301, resistive load 302, scale block 303, analog-to-digital converter block(s) 304, low-pass filter block 305, learned primary load block 306, arc window comparator block 307, phase locked loop block 308, power supply block 109, bias generator block 110, error accumulator block 311, histogram probability density block 312, normalizing block 313, model probability density block 314, and periodic noise detector block 316. Elements 301-313 and 316 can perform functions substantially similar to those performed by elements 101-113 and 116 in illustrative processing block diagram 100.

Figure 4:
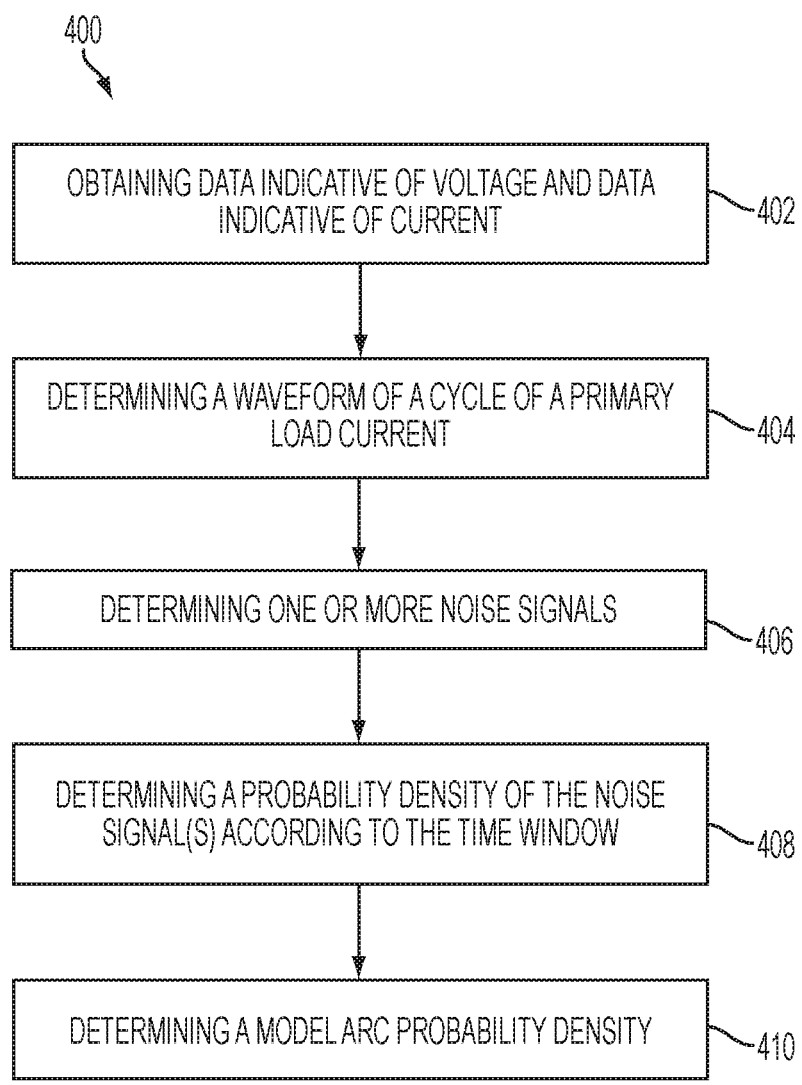
FIG. 4 shows an illustrative method of determining a model probability density according to an illustrative embodiment of the present invention.

FIG. 4 shows an illustrative method 400 of determining a model probability density according to an illustrative embodiment of the present invention, which can include obtaining data indicative of voltage and data indicative of current at step 402, determining a waveform of a cycle of a primary load current at step 404, determining one or more noise signals at step 406, determining a probability density of one or more noise signals according to a time window at step 408, and determining a model probability density at step 410. The current can be from a conductor on which arcing is induced through a medium of a desired composition, such as, for example, air or carbon. Moreover, one skilled in the art will appreciate that arcing will likely occur through any medium in any electrical system after a sufficiently long period of time, and that such arcing is more likely to occur within a shorter period of time in electrical systems with higher voltage. Accordingly, exemplary embodiments of the present invention facilitate determination of model arc probability density at different voltage magnitudes where voltages of about 120 V, 220 V, or 7,500 V can be used to obtain a model probability density for arcing. High voltage application may further benefit from the modeling and detection techniques of the present invention, since the time period during which an arcing event can occur is shorter. Steps 402-408 can be substantially similar to steps 202-208 in illustrative method 200.

At step 410, a model probability density can be determined. For example, a model probability density can be substantially equal to a probability density or normalized probability density of one or more noise signals of step 408. In an illustrative embodiment of the present invention, a model probability density can be stored in model probability density block 314. In an illustrative embodiment of the present invention, a model probability density can be stored in computer-readable media including, but not limited to, non-transitory computer-readable media.

Normalizing block 313 can normalize the probability density of one or more noise signals. For example, a processing block can find the highest energy or amplitude value in the amplitude intervals. Each amplitude interval can be divided by this value. The result can be a probability density including a maximum value of 1.0. Similarly, model probability densities may already be stored in a normalized form. This process may permit comparing a shape of the probability density of one or more noise signals without concern for the actual value of the amplitude. Another byproduct of normalization may be a measurement of energy.

This energy measurement can be performed here or on data input to histogram probability density block 312. If the energy level is too low, a model probability density may not be determined. The intervals in the probability density of one or more noise signals can contain a sufficient amount of energy if they contain more energy than a minimum energy value. Alternatively, since energy is proportional to the square of the amplitude, the intervals in the probability density of one or more noise signals can contain a sufficient amount of energy if the highest amplitude is greater than a minimum amplitude value. The normalized probability density of one or more noise signals can be then stored in a model probability density block 314. This model probability density can be then used with systems or methods for detecting and identifying arcing according to illustrative embodiments of the present invention.

The components of the illustrative devices, systems and methods employed in accordance with the illustrated embodiments of the present invention can be implemented, at least in part, in digital electronic circuitry, analog electronic circuitry, or in computer hardware, firmware, software, or in combinations of them. These components can be implemented, for example, as a computer program product such as a computer program, program code or computer instructions tangibly embodied in an information carrier, or in a machine-readable storage device, for execution by, or to control the operation of, data processing apparatus such as a programmable processor, a computer, or multiple computers. Examples of the computer-readable recording medium include, but are not limited to, read-only memory (ROM), random-access memory (RAM), CD-ROMs, magnetic tapes, floppy disks, optical data storage devices. It is envisioned that aspects of the present invention can be embodied as carrier waves (such as data transmission through the Internet via wired or wireless transmission paths). A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a communication network. The computer-readable recording medium can also be distributed over network-coupled computer systems so that the computer-readable code is stored and executed in a distributed fashion. Also, functional programs, codes, and code segments for accomplishing the present invention can be easily construed as within the scope of the invention by programmers skilled in the art to which the present invention pertains. Method steps associated with the illustrative embodiments of the present invention can be performed by one or more programmable processors executing a computer program, code or instructions to perform functions (for example, by operating on input data and/or generating an output). Method steps can also be performed by, and apparatus of the invention can be implemented as, special purpose logic circuitry, for example, an FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. The essential elements of a computer are a processor for executing instructions and one or more memory devices for storing instructions and data. Generally, a computer will also include, or be operatively coupled to receive data from or transfer data to, or both, one or more mass storage devices for storing data, for example, magnetic, magneto-optical disks, or optical disks. Information carriers suitable for embodying computer program instructions and data include all forms of non-volatile memory, including by way of example, semiconductor memory devices, for example, EPROM, EEPROM, and flash memory devices; magnetic disks, for example, internal hard disks or removable disks; magneto-optical disks; and CD-ROM and DVD-ROM disks. The processor and the memory can be supplemented by, or incorporated in special purpose logic circuitry.

The above-presented description and figures are intended by way of example only and are not intended to limit the present invention in any way except as set forth in the following claims. It is particularly noted that persons skilled in the art can readily combine the various technical aspects of the various elements of the various exemplary embodiments that have been described above in numerous other ways, all of which are considered to be within the scope of the invention.

The above-described exemplary embodiments of an apparatus, system and method in computer-readable media include program instructions to implement various operations embodied by a computer. The media may also include, alone or in combination with the program instructions, data files, data structures, and the like. The media and program instructions may be those specially designed and constructed for the purposes of the present invention, or they may be of the kind well-known and available to those having skill in the computer software arts. Examples of computer-readable media include magnetic media such as hard disks, floppy disks, and magnetic tape; optical media such as CD ROM disks and DVD; magneto-optical media such as optical disks; and hardware devices that are specially configured to store and perform program instructions, such as read-only memory (ROM), random access memory (RAM), flash memory, and the like. The media may also be a transmission medium such as optical or metallic lines, wave guides, and so on, and is envisioned include a carrier wave transmitting signals specifying the program instructions, data structures, and so on. The computer-readable recording medium can also be distributed over network-coupled computer systems so that the computer-readable code is stored and executed in a distributed fashion. Examples of program instructions include both machine code, such as produced by a compiler, and files containing higher level code that may be executed by the computer using an interpreter. The described hardware devices may be configured to act as one or more software modules in order to perform the operations of the above-described embodiments of the present invention.

Although exemplary embodiments of the present invention have been disclosed for illustrative purposes, those skilled in the art will appreciate that various modifications, additions, and substitutions are possible, without departing from the scope of the present invention. Therefore, the present invention is not limited to the above-described embodiments, but is defined by the following claims, along with their full scope of equivalents.

What is claimed is:

1. A method for detecting and identifying arcing comprising:
   converting a current from a load to a proportional voltage;
   converting the current to a digitized current at a sample frequency;
   converting the proportional voltage to a digitized voltage at the sample frequency;
   determining a waveform of a cycle of a primary load current based on the digitized current; and
   determining at least one noise signal according to the determined waveform of the cycle of the primary load current and the digitized current;
   setting a time window within a cycle of the digitized voltage by setting a start time and a stop time of a time interval based on voltage amplitude at the start time and the stop time being within a predetermined value of the peak voltage of the waveform of the cycle of the digitized voltage;
   determining a probability density of the at least one noise signal according to the set time window;
   comparing the probability density of the at least one noise signal with at least one model probability density; and
   generating an output indicative of a positive arc detection based on the comparing when the time window is set based on values of the digitized voltage indicative of the arc.

2. The method for detecting and identifying arcing of claim 1, wherein:
   the converting of the current from the load to the proportional voltage comprises reducing the voltage to an amplitude and a DC offset suitable for analog-to-digital conversion prior to the converting of the current to the digitized current and the converting of the voltage to the digitized voltage.

3. The method for detecting and identifying arcing of claim 2, further comprising removing high frequency noise from the voltage.

4. The method for detecting and identifying arcing of claim 2, wherein the sample frequency is equal to a multiple of the voltage cycle frequency.

5. The method for detecting and identifying arcing of claim 4, further comprising determining the voltage cycle frequency.

6. The method for detecting and identifying arcing of claim 1, further comprising determining one of the at least one noise signal by subtracting the determined waveform of a cycle of the primary load current from one of at least one cycle of the digitized current.

7. The method for detecting and identifying arcing of claim 6, further comprising adjusting the determined waveform of at least a portion of a cycle of the primary load current according to one of the at least one noise signals.

8. The method for detecting and identifying arcing of claim 7, wherein the adjusting of the determined waveform is by an error accumulator block.

9. The method for detecting and identifying arcing of claim 7, wherein the adjusting of the determined waveform comprises adding or subtracting a fraction of the one of the at least one noise signal to or from the determined waveform of a cycle of the primary load current.

10. The method for detecting and identifying arcing of claim 1, wherein the voltage amplitude at the start of the time interval and the stop of the time interval is within an upper portion of the peak voltage of the cycle of the digitized voltage.

11. The method for detecting and identifying arcing of claim 1, wherein the determining of the probability density of the at least one noise signal comprises determining a histogram indicative of the at least one noise signal,
wherein the histogram comprises a plurality of counts,
wherein each count is indicative of a number of amplitude bits of the at least one signal within one of a plurality of amplitude intervals, and
wherein the amplitude bits are within the time window of one of the at least one noise signal.

12. The method for detecting and identifying arcing of claim 11, further comprising comparing the probability density of the at least one noise signal with at least one model probability density by at least one of:
determining a normalized histogram indicative of the at least one noise signal by normalizing the histogram indicative of the at least one noise signal; and
determining a positive arc detection if the normalized histogram indicative of the at least one noise signal is similar to one of the at least one model probability density according to a pattern matching algorithm.

13. The method for detecting and identifying arcing of claim 12, further comprising normalizing the histogram indicative of the at least one noise signal by dividing each amplitude interval by a highest amplitude value in the plurality of amplitude intervals.

14. The method for detecting and identifying arcing of claim 12, further comprising determining the positive arc detection only if the histogram indicative of a highest amplitude value in a plurality of intervals in the histogram indicative of the at least one noise signal is greater than a minimum amplitude value.

15. The method for detecting and identifying arcing of claim 12, wherein the at least one model probability density is a normalized model probability density.

16. The method for detecting and identifying arcing of claim 1, wherein, if a normal periodic arcing noise is determined in one of the at least one noise signals, the probability density is determined by excluding the one of the at least one noise signal.

17. The method for detecting and identifying arcing of claim 1, wherein the at least one model probability density comprises at least one arc probability density.

18. The method for detecting and identifying arcing of claim 1, further comprising outputting an arc detect signal for tripping an arc fault circuit interrupter upon the positive arc detection.

19. A method for determining a model probability density for detecting and identifying arcing comprising:
measuring a current in a conductor when inducing arcing in the conductor;
converting the current to a proportional voltage;
converting the current to a digitized current at a sample frequency;
converting the proportional voltage to a digitized voltage at the sample frequency;
determining a waveform of a cycle of a primary load current according to the digitized current;
determining at least one noise signal according to the determined waveform of the cycle of the primary load current and the digitized current;
setting a time window within a cycle of the digitized voltage by setting a start time and a stop time of a time interval based on voltage amplitude at the start time and the stop time being within a predetermined value of the peak voltage of the waveform of the cycle of the digitized voltage;
determining a probability density of the at least one noise signal according to the time window;
determining a model probability density at a voltage magnitude; and
storing data indicative of the model probability density at the voltage magnitude in a non-transitory computer-readable medium as a reference for a positive arc detection at the voltage magnitude.

20. The method for detecting and identifying arcing of claim 1, wherein the voltage amplitude at the start of the time interval and the stop of the time interval is within 10% of the peak voltage of the cycle of the digitized voltage.

* * * * *